Feb. 18, 1964 N. T. WATTERS 3,121,803
STAIR-STEP COUNTER WITH PULSE STORAGE CAPACITOR TRIGGERING, VIA ANTI-LEAKAGE DIODE, TRANSISTOR BLOCKING OSCILLATOR
Filed May 28, 1959
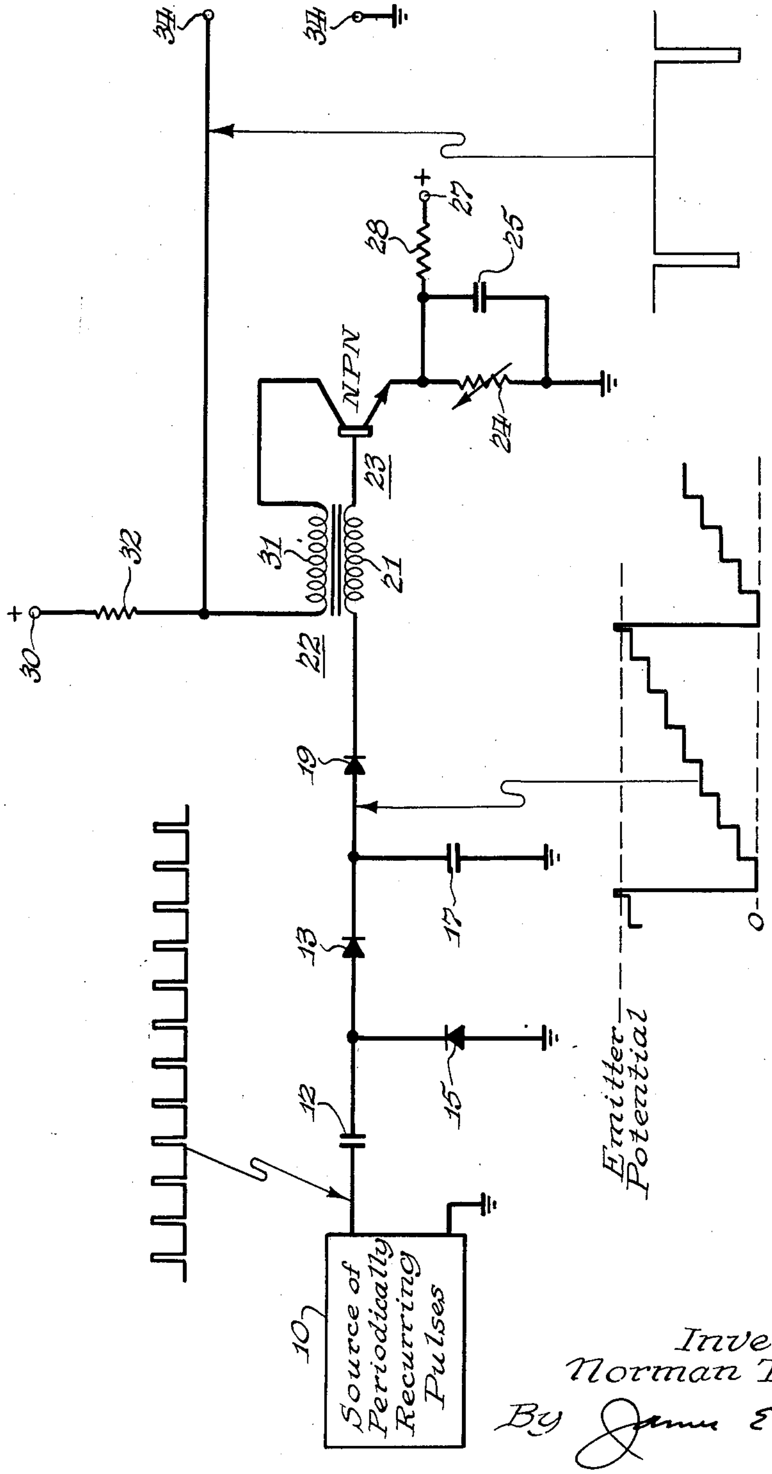
Inventor
Norman T. Watters
By James E. Tracy
Attorney United States Patent Office 3,121,803
Patented Feb. 18, 1964

3,121,803
STAIR-STEP COUNTER WITH PULSE STORAGE CAPACITOR TRIGGERING, VIA ANTI-LEAKAGE DIODE, TRANSISTOR BLOCKING OSCILLATOR

Norman T. Watters, Elmhurst, Ill., assignor to Zenith Radio Corporation, a corporation of Delaware Filed May 28, 1959, Ser. No. 816,598
5 Claims. (Cl. 307—88.5)

This invention relates generally to counting apparatus and more particularly to a transistor circuit for counting a series of input pulses.

Counting circuits are used in many different environments in order to effectively count a number of input pulses, wether they occur periodically or randomly. When the pulses are periodically recurring, the counter constitutes a frequency divider. As just one example, a counting apparatus is disclosed in copending patent application Serial No. 479,170, filed December 31, 1954, in the name of Erwin M. Roschke, and assigned to the present assignee. There, the counter is supplied with periodically recurring line- or horizontal-drive pulses from a television system to effect a frequency division thereof, the output pulses of the counter being subsequently utilized to develop an encoding signal.

One well known counter comprises a stair-step counting circuit or generator which charges a storage condenser in step-by-step fashion in response to successive input pulses. When the charge on the condenser assumes or reaches a predetermined step or threshold level, a discharge circuit in the form of a blocking oscillator is triggered or fired into operation to discharge the condenser back to its starting charge condition from which another sequence of counting steps is initiated. The counting or count-down ratio is determined by the particular parameters employed. Such a conventional counting mechanism has found wide scale use in the past when the blocking oscillator included the usual triode vacuum tube. However, when the transistorized version or equivalent of the vacuum tube blocking oscillator is combined with the stair-step counting circuit, the charge on the storage condenser is subject to be influenced by the bias condition of the transistor due to undesired leakage which may be present in the transistor. To this end, the present invention is directed to a transistorized counting apparatus which overcomes the above problem.

Accordingly, it is an object of the invention to provide a new and improved counting apparatus.

It is another object of the invention to provide an improved transistorized counting apparatus.

It is still another object of the invention to provide a counting apparatus of the type including a stair-step counting circuit which charges a storage condenser in stair-step fashion, and a transistorized discharge circuit, where the charge on the storage condenser is not affected by any undesired leakage through the transistor.

A counting apparatus, constructed in accordance with the present invention, comprises a source of signal pulses. A stair-step counting circuit, including a storage condenser, is coupled to the source and develops across the condenser a voltage having a stair-step wave shape with successive steps initiated by successive ones of the pulses. There is a transistor having base, emitter and collector electrodes. A charge circuit is provided for the condenser and includes the base-emitter conduction path of the transistor. As employed herein, "charge circuit" is generic to either a charging or discharging circuit. There are means for normally biasing the transistor to its non-conducting condition to render the charge circuit inoperative. The bias is overcome to render the charge circuit operative when the stair-step wave shape reaches a predetermined step. Finally, the counting apparatus comprises a unidirectional translating device included in the charge circuit to prevent the storage condenser from varying its charge, when the transistor is biased to its cut-off condition, due to undesirable leakage through the base-emitter conduction path.

The features of this invention which are believed to be new are set forth with particularity in the appended claims. The invention, together with further objects and advantages thereof, may best be understood, however, by reference to the following description in conjunction with the accompanying drawing in which the single figure illustrates a counting apparatus embodying the invention.

Referring now to the drawing, there is a source 10 of periodically recurring pulses. When the counting mechanism to be described is incorporated in a subscription television system of the type disclosed in the aforementioned copending Roschke application, source 10 may be the synchronizing-signal generator in the television transmitter or the line-sweep system in the receiver, each of which provides periodically recurring line-drive pulses at a frequency of 15,750 cycles per second. One output terminal of source 10 is connected to ground and the other is coupled through a condenser 12 to the plate terminal of a unidirectional translating device, such as a diode, 13. The junction of condenser 12 and the plate terminal of diode 13 is connected to the cathode terminal of another unidirectional translating device, such as another diode, 15, the cathode of which is connected to ground. The cathode terminal of diode 13 is connected to one terminal of a storage condenser 17, the other terminal of which is connected to ground.

Units 12, 13, 15 and 17 collectively constitute a well-known stair-step counting circuit which, in response to applied signal pulses, develops across condenser 17 a stair-step wave shape with successive steps initiated by successive ones of the pulses.

The junction of the cathode terminal of diode 13 and condenser 17 is connected to the plate terminal of another unidirectional translating device in the form of a diode 19, and the cathode of diode 19 is coupled through the secondary winding 21 of a transformer 22 to the base electrode of a NPN transistor 23. The emitter of the transistor is coupled through a variable resistor 24, which is bypassed by a condenser 25, to ground. The emitter is also connected to a source of positive potential 27 through a resistor 28 to provide a fixed bias for the transistor, namely in order to establish the emitter at a potential which is positive with respect to that of the base to normally bias the transistor to its non-conducting condition. Units 19, 21, 24 and the base-emitter path of transistor 23 form a discharge circuit for condenser 17.

The collector of transistor 23 is connected to another source of positive potential 30 through the primary winding 31 of transformer 22 and a resistor 32 connected in series. A pair of output terminals 34 are provided for the counting apparatus; one is connected to ground and the other to the junction of primary winding 31 and resistor 32.

All the circuitry to the right of diode 19 may be recognized as a conventional transistorized blocking oscillator which produces a signal pulse in its output circuit each time it is triggered or fired into operation.

Considering now the operation of the described counting apparatus, a series of periodically recurring positive pulses are produced at the ungrounded output terminal of source 10, as shown, and are applied to the plate of diode 13 through condenser 12. The diode conducts and thus the pulses from source 10 are divided between condensers 12 and 17. Assuming that condenser 17 starts from a zero charge condition, each input pulse builds up the charge in a positive direction in step-by-step, well known fashion as shown by the wave form at the ungrounded terminal of condenser 17. During the occurrence of each positive pulse from source 10 diode 15 is cut off, but subsequent to each occurrence it conducts due to the potential built up across condenser 12 in order to remove the charge on that condenser. Of course, as is well known, the electrical size of condenser 17 is usually larger than that of condenser 12.

During the interval that condenser 17 is building up a charge in step-by-step manner, transistor 23 is not conducting due to the fixed bias on its emitter. However, since the stair-step wave shape developed across storage condenser 17 is applied to the base of the transistor, an instant or step will be reached when the base becomes instantaneously positive with respect to the emitter; this causes transistor 23 to conduct. Once the transistor is turned on, current flows through its collector circuit and primary winding 31 induces a voltage across secondary 21 of a polarity such that the base of the transistor becomes more positive, as in conventional blocking oscillator type operation, which in turn increases both the base and collector current flow in usual regenerative action.

During the time the base-emitter conduction path of transistor 23 is conducting, the discharge circuit for condenser 17 is operative and thus the condenser discharges through the base-emitter path. Since the current flows from condenser 17 to the emitter during the discharge time, diode 19 is effectively a short circuit. Even though the potential on the emitter is always positive with respect to ground, condenser 17 discharges beyond that level, in fact all the way to ground potential, because of the effect of secondary 21. During the discharge time diodes 15 and 13 also conduct which effectively clamps the junction of diode 19 and secondary 21 to ground; condenser 17 thus discharges to ground rather than to the potential on the emitter which is approximately the same as that on the base at that time.

After the storage condenser has discharged, the blocking oscillator is once again cut off and another cycle of counting steps is executed as shown by the wave form across condenser 17. During each of the relatively short time intervals that collector current flows in the transistor, the voltage drops considerably at the junction of resistor 32 and primary winding 31 and thus negative polarity pulses are developed across output terminals 34, as shown, commensurate with the frequency division or count-down ratio of the apparatus. As illustrated, the counter is operated at a frequency division of 8:1 but, of course, this division may be raised or lowered by changing the electrical sizes of the various components involved. For example, the bias on the emitter may be varied, as evidenced by the fact that resistor 24 is variable, to change the operating frequency.

In the absence of unidirectional translating device 19 the described counting apparatus may possibly suffer from the shortcoming that even though the transistor is turned off due to the effect of biasing source 27 during the charge up time of condenser 17, the charge on that condenser may be raised toward the higher positive potential which appears at the emitter because of undesirable leakage through the base-emitter conduction path. In other words, during each of the time intervals between successive input pulses from source 10 the voltage appearing across condenser 17 rather than remaining constant may very well tend to increase toward the emitter potential.

Of course, there is not a counterpart problem when a vacuum tube type discharge circuit is employed since the resistance between cathode and grid is sufficiently high that no leakage is encountered. However, in the present case, the effect of transistor leakage must be taken into account and in accordance with the present invention the base-emitter conduction path of the transistor is isolated from storage condenser 17 by the expedient of unidirectional translating device 19 being inserted in series with the discharge circuit. With the incorporation of such a diode, during the time that the blocking oscillator is cut-off the diode is likewise cut off. If leakage current tends to flow from emitter to base, the potential at the base is very close to that at the emitter and thus the potential on the cathode of diode 19 would be positive with respect to that on its cathode; it is thus impossible for diode 19 to conduct. Of course, for most unidirectional translating devices there is no leakage current from cathode to plate.

While an NPN type transistor has been included in the blocking oscillator, a transistor of opposite gender, namely PNP, can be employed. The emitter would then be established at a negative bias with respect to the base and the pulses from source 10 may exhibit negative polarity. Diodes 15, 13 and 19 would then be effectively turned around or reversed and storage condenser 17 would charge in a negative direction. During the time the blocking oscillator conducts, the storage condenser would discharge from a negative potential to zero, or viewed differently would charge in a positive direction to ground potential. Since the base-emitter conduction path may therefore be employed to vary the charge on the storage condenser in either direction, the more generic designation of "charge circuit" describes the base-emitter path.

It should also be realized that the bias may be applied to the transistor, whether of NPN or PNP type, in many of a variety of different ways. For example, with an NPN type transistor, the emitter may be essentially connected to ground and a negative potential source may be connected to the plate of diode 15. With such an arrangement when the transistor is turned on the storage condenser charges substantially to the potential of the negative source connected to diode 15 and responsive to each input pulse (which would be of positive polarity) from source 10 condenser 17 would lose one more increment of charge. The time is reached when the charge on the storage condenser would go from slightly negative with respect to ground to slightly positive, at which instant the transistor conducts causing the storage condenser to once again charge up to the potential of the negative source. This again demonstrates that the circuitry to the right of storage condenser 17 may more aptly be considered a charge circuit which is generic to both charging and discharging circuits.

The described counting apparatus has been constructed and operated very satisfactorily. The parameters of the various components involved were as follows:

| | | |
|---|---|---|
| Condenser **12** | micromicrofarads | 220 |
| Diode **15** | | 1N307 |
| Diode **13** | | 1N307 |
| Storage condenser **17** | microfarads | .00275 |
| Diode **19** | | 1N307 |
| NPN transistor **23** | | 2N78 |
| Resistor **24** | ohms | 10K |
| Condenser **25** | microfarads | 50 |
| Resistor **28** | ohms | 4.7K |
| Source **27** | volts | +22.5 |
| Resistor **32** | ohms | 68 |
| Source **30** | volts | +22 |

The invention provides, therefore, a transistorized counting apparatus in which the charge on a storage condenser is varied in step-by-step fashion. A charge circuit including the base-emitter conduction path of a transistor becomes operative to vary the charge on the condenser when a predetermined step is reached. A unidirectional translating device is included in the charge circuit for isolation purposes in order to prevent the charge on the condenser from being influenced due to undesirable leakage through the base-emitter conduction path of the transistor during intervals when the transistor is cut off.

While a particular embodiment of the invention has been shown and described, it is apparent that modifications and alterations may be made, and it is intended in the appended claims to cover all such modifications and alterations as may fall within the true spirit and scope of the invention.

I claim:

1. Counting apparatus comprising: a source of signal pulses; a stair-step counting circuit, including a storage condenser, coupled to said source for developing across said condenser a voltage having a stair-step wave shape with successive steps initiated by successive ones of said pulses; a transistor having base, emitter and collector electrodes; a charge circuit for said condenser including the base-emitter conduction path of said transistor; means for normally biasing said transistor to its non-conducting condition to render said charge circuit inoperative, the bias being overcome to render said charge circuit operative when said stair-step wave shape reaches a predetermined step; and a unidirectional translating device included in said charge circuit to prevent said storage condenser from varying its charge, when said transistor is biased to its cut-off condition, due to undesirable leakage through said base-emitter conduction path.

2. Counting apparatus comprising: a source of periodically recurring pulses; a stair-step counting circuit, including a storage condenser, coupled to said source for developing across said condenser a voltage having a stair-step wave shape with successive steps initiated by successive ones of said pulses; a transistor having base, emitter and collector electrodes; a charge circuit for said condenser including the base-emitter conduction path of said transistor; means for normally biasing said transistor to its non-conducting condition to render said charge circuit inoperative, the bias being overcome to render said charge circuit operative when said stair-step wave shape reaches a predetermined step; and a diode connected in series with said charge circuit between said condenser and said base-emitter conduction path to prevent said storage condenser from varying its charge, when said transistor is biased to its cut-off condition, due to undesirable leakage through said base-emitter conduction path.

3. Counting apparatus comprising: a source of signal pulses; a stair-step counting circuit, including a storage condenser, coupled to said source for charging said condenser to develop thereacross a voltage having a stair-step wave shape with successive steps initiated by successive ones of said pulses; a transistor having base, emitter and collector electrodes; a discharge circuit for said condenser including the base-emitter conduction path of said transistor; means for normally biasing said transistor to its non-conducting condition to render said discharge circuit inoperative, the bias being overcome to render said discharge circuit operative when said stair-step wave shape reaches a predetermined step thereby discharging said condenser; and a unidirectional translating device included in said discharge circuit to prevent said storage condenser from varying its charge, when said transistor is biased to its cut-off condition, due to undesirable leakage through said base-emitter conduction path.

4. Counting apparatus comprising: a source of signal pulses; a stair-step counting circuit, including a storage condenser, coupled to said source for charging said condenser to develop thereacross a voltage having a stair-step wave shape with successive steps initiated by successive ones of said pulses; an NPN type transistor having base, emitter and collector electrodes; a discharge circuit for said condenser including the base-emitter conduction path of said transistor; means for establishing said emitter at a potential positive with respect to that of said base to normally bias said transistor to its non-conducting condition to render said discharge circuit inoperative, the bias being overcome to render said discharge circuit operative when said stair-step wave shape reaches a predetermined step thereby discharging said condenser; and a unidirectional translating device included in said discharge circuit to prevent said storage condenser from charging toward the potential at said emitter, when said transistor is biased to its cut-off condition, due to undesired leakage through said base-emitter conduction path.

5. Counting apparatus comprising: a source of signal pulses; a stair-step counting circuit, including a storage condenser, coupled to said source for developing across said condenser a voltage having a stair-step wave shape with successive steps initiated by successive ones of said pulses; a transistor having base, emitter and collector electrodes; a charge circuit, including a blocking oscillator, for said condenser and also including the base-emitter conduction path of said transistor; means for normally biasing said transistor to its non-conducting condition to render said charge circuit inoperative, the bias being overcome to render said charge circuit operative when said stair-step wave shape reaches a predetermined step to produce a signal pulse in said blocking oscillator; and a unidirectional translating device included in said charge circuit to prevent said storage condenser from varying its charge, when said transistor is biased to its cut-off condition, due to undesirable leakage through said base-emitter conduction path.

References Cited in the file of this patent

UNITED STATES PATENTS

| | | |
|---|---|---|
| 2,871,378 | Lohman | Jan. 27, 1959 |
| 2,873,388 | Trumbo | Feb. 10, 1959 |